(12) United States Patent
Lee et al.

(10) Patent No.: US 7,479,661 B2
(45) Date of Patent: Jan. 20, 2009

(54) NITRIDE SEMICONDUCTOR LIGHT EMITTING DEVICE

(75) Inventors: Jae Hoon Lee, Kyungki-do (KR); Hee Seok Choi, Seoul (KR); Jeong Tak Oh, Kyungki-do (KR); Su Yeol Lee, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 250 days.

(21) Appl. No.: 11/435,751

(22) Filed: May 18, 2006

(65) Prior Publication Data

US 2006/0261367 A1    Nov. 23, 2006

(30) Foreign Application Priority Data

May 19, 2005    (KR)    ............... 10-2005-0042090

(51) Int. Cl.
*H01L 33/00*    (2006.01)

(52) U.S. Cl. ................. 257/97; 257/103; 257/E33.034

(58) Field of Classification Search ............... 257/97
See application file for complete search history.

(56) References Cited

U.S. PATENT DOCUMENTS 5,903,017 A * 5/1999 Itaya et al. ............... 257/190

FOREIGN PATENT DOCUMENTS

JP    2001-274378    10/2001

* cited by examiner

*Primary Examiner*—Jerome Jackson, Jr.
(74) *Attorney, Agent, or Firm*—McDermott Will & Emery LLP

(57) ABSTRACT

The invention provides a nitride semiconductor device and a manufacturing method thereof. In the invention, n-type and p-type nitride semiconductor layers are formed on a substrate, and an active layer is formed therebetween. The n-type nitride semiconductor layers include first and second n-type GaN layers disposed in the order of distance from the active layer. In addition, in the nitride semiconductor device of the invention, an $Al_xGa_{1-x}N$ layer, where $0<x<1$, is interposed between the first and second n-type GaN layers, thereby forming a two-dimensional electron gas layer at interfaces of the first and second n-type GaN layers.

14 Claims, 2 Drawing Sheets

NITRIDE SEMICONDUCTOR LIGHT EMITTING DEVICE

CLAIM OF PRIORITY

This application claims the benefit of Korean Patent Application No. 2005-42090 filed on May 19, 2005 in the Korean Intellectual Property Office, the disclosure of which is incorporated herein by reference.

BACKGROUND OF THE INVENTION

1. Field of the Invention

The present invention relates to a nitride semiconductor light emitting device, more particularly to a high brightness nitride semiconductor light emitting device improved in current spreading effect via a novel heterogeneous bonding structure.

2. Description of the Related Art

In general, a nitride semiconductor layer is a group III-V semiconductor crystal such as GaN, InN, and AlN, which is broadly utilized in a light emitting device capable of generating light of short wavelength (ultraviolet rays or green light), especially blue light. The nitride semiconductor light emitting device is fabricated with an insulating substrate such a sapphire substrate or a SiC substrate which satisfies lattice match conditions for the crystal growth. Therefore, typically, the nitride semiconductor light emitting device has a planar structure in which two electrodes coupled to p- and n-nitride semiconductor layers are arranged to face the same direction on the light emitting structure.

Compared to a vertical light emitting device having two electrodes on opposed faces of the light emitting structure, the planar nitride light emitting device is disadvantaged in that an effective area for light emitting is not large-sized due to non-uniform current distribution across the light emitting area and thus light emitting efficiency per light-emitting area is low. FIG. 1 explains the planar light emitting device and limited light emitting efficiency thereof.

FIG. 1 illustrates an example of a conventional nitride semiconductor device 10.

The semiconductor light emitting device 10 shown in FIG. 1 includes a sapphire substrate 11, a buffer layer 12 formed on the substrate 11, an n-type nitride semiconductor layer 14 formed on the buffer layer 12, an active layer 17 formed on the n-type nitride semiconductor layer 14, and a p-type nitride semiconductor layer 16 formed on the active layer 17. A p-electrode 19b is formed on the p-type nitride semiconductor layer 18. Meanwhile, an n-electrode 19a is formed on an exposed area of the n-type nitride semiconductor layer 14 after the p-type nitride semiconductor layer 18 and the active layer 17 are partially removed via mesa-etching.

In this planar semiconductor light emitting device 10, current between two electrodes is concentrated in the shortest route thereof, resulting in a current crowing area A. Also, due to big series resistance caused by horizontal current flow, the planar semiconductor light emitting device 10 exhibits relatively high operating voltage. Disadvantageously, this reduces an effective area for light emitting.

In addition, current crowding causes a great amount of current to be applied in case of a temporary spark or overload. Consequently, heat generated at this time renders the device easily breakable, and thus weakly resistant to electrostatic discharge (ESD). Especially, the n-type nitride area shows lower crystalinity due to high doping concentration of impurities such as Si. Also, the n-type nitride area exhibits extremely low resistance to ESD in the current crowing area A.

SUMMARY OF THE INVENTION

The present invention has been made to solve the foregoing problems of the prior art and it is therefore an object of the present invention to provide a high-efficient nitride semiconductor light emitting device with excellent current spreading effect by forming an appropriate two-dimensional electronic gas layer (2DEG) in an n-type nitride area to increase sheet carrier concentration and enhance electron mobility.

According to an aspect of the invention for realizing the object, there is provided a nitride semiconductor light emitting device comprising n-type and p-type semiconductor layers formed on a substrate; and an active layer formed therebetween, wherein the n-type nitride semiconductor layers include first and second n-type GaN layers disposed in the order of distance from the active layer, the device further comprising an $Al_xGa_{1-x}N$ layer, where $0<x<1$, interposed between the first and second n-type GaN layers, thereby forming a two-dimensional electron gas (2DEG) layer at interfaces of the first and second n-type GaN layers.

This allows formation of the 2DEG layer on the $Al_xGa_{1-x}N$ ($0<x<1$) layer, resulting in higher electron mobility and thus uniform current spreading.

To form a desired two-dimensional electronic gas layer, the $Al_xGa_{1-x}N$ ($0<x<1$) layer needs to have an adequate thickness and Al content. Preferably, the $Al_xGa_{1-x}N$ layer has a thickness of about 100 Å to 500 Å. Preferably, the $Al_xGa_{1-x}N$ layer contains x in the range of about 0.05 to 0.5. The $Al_xGa_{1-x}N$ layer comprises an undoped layer where impurities are intentionally undoped.

Additionally, the nitride semiconductor light emitting device further comprises an AlN layer disposed between the $Al_xGa_{1-x}N$ layer and the first or the second n-type GaN layer. The AlN layer employed in the invention generates a beneficial piezoelectric effect for increasing electron concentration of the 2 DEG layer. Also, the AlN layer blocks dislocation as an insulation layer and boosts current spreading effect further. To achieve such effect properly, preferably, the AlN layer has a thickness of about 5 Å to 30 Å.

The nitride semiconductor light emitting device may further comprise a GaN layer disposed between the substrate and the first n-type GaN layer, the GaN layer doped with less than 1 mol % Al.

The invention may be adopted in a planar light emitting device which experiences deterioration in current spreading effect. The planar light emitting device is mesa-etched to expose a partial area of the n-type nitride layer.

In this case, the exposed area of the mesa-etched n-type nitride semiconductor layer is substantially flush with the interface of the first n-type GaN layer where the two-dimensional electron gas layer is formed. Also, the exposed area of the mesa-etched n-type nitride semiconductor layer is in a plane lower than that of the interface of the first n-type GaN layer where the two-dimensional electron gas layer is formed.

In a specific embodiment of the invention, the nitride semiconductor light emitting device further comprises a high-resistant GaN layer formed between the first n-type GaN layer and the $Al_xGa_{1-x}N$ layer, where impurities are intentionally undoped, wherein the two-dimensional electron gas layer is formed at an interface of the high-resistant GaN layer. In this case, the high-resistant GaN layer additionally boosts current spreading effect. Preferably, the high-resistant GaN layer has a thickness of 80 Å to 200 Å.

In the planar light emitting device according to the embodiment of the invention, preferably, the high-resistant GaN layer is provided on the exposed area of the mesa-etched n-type nitride semiconductor layer.

The invention may be advantageously adopted in a vertical nitride light emitting device. In the vertical nitride light emitting device, the high-resistant GaN layer has a thickness of 80 Å to 200 Å.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
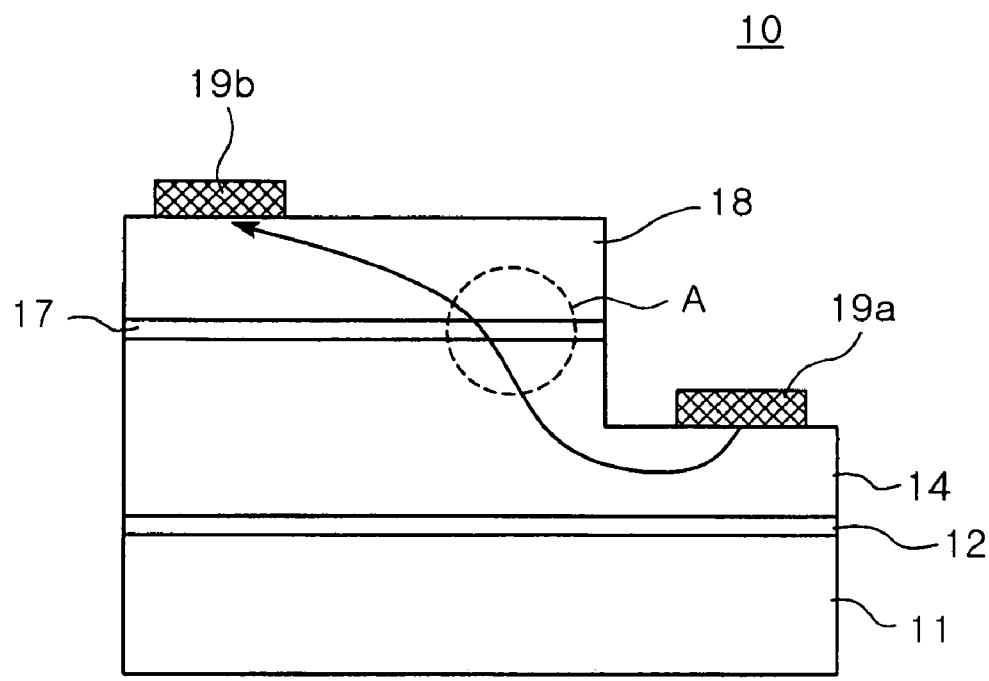
FIG. 1 is a vertical cross-sectional view illustrating a conventional nitride semiconductor light emitting device.
Figure 2:
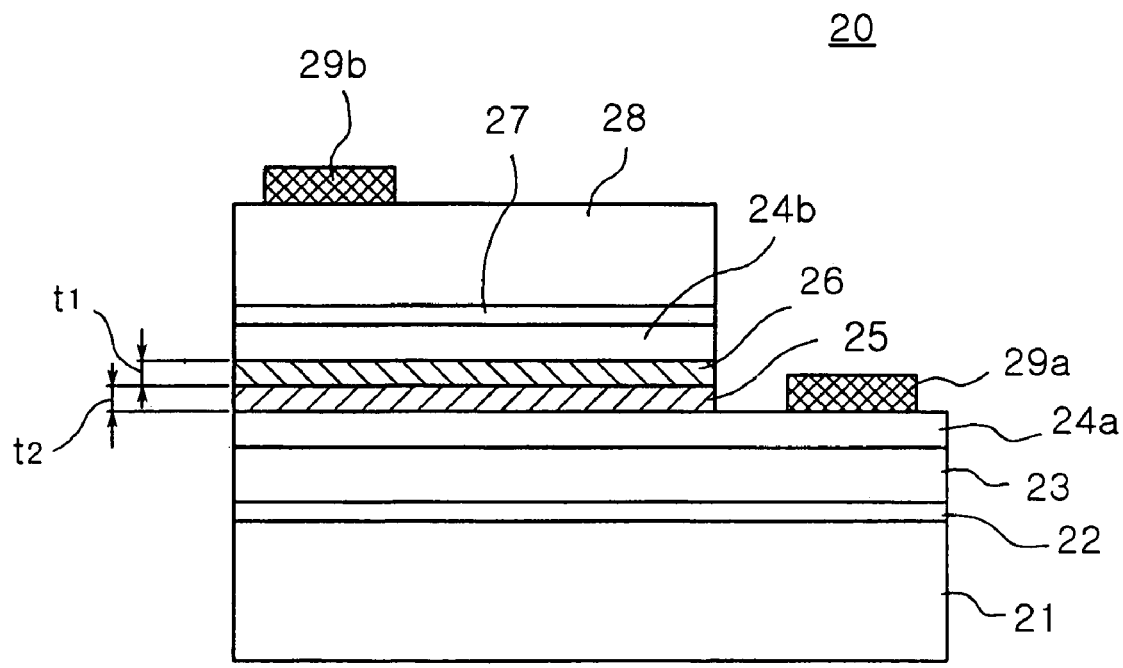
FIG. 2 is a vertical cross-sectional view illustrating a nitride semiconductor light emitting device according to one embodiment of the invention.

FIG. 2 is a vertical cross-sectional view illustrating a nitride semiconductor light emitting device according to one embodiment of the invention.

First, referring to FIG. 2, the nitride semiconductor light emitting device 20 according to this embodiment includes a sapphire substrate 21, a buffer layer 22 formed on the sapphire substrate 21, n-type nitride semiconductor layers 24a and 24b formed on the buffer 22, an active layer 27 formed on the n-type nitride semiconductor layer 24b and a p-type nitride semiconductor layer 28 formed on the active layer 27. An n-electrode 29a and a p-electrode 29b are disposed to connect to the n- and p-type nitride semiconductor layers, respectively.

The n-type nitride semiconductor layers include a first n-type GaN layer 24a and a second n-type GaN layer 24b in the order of distance from the active layer 27. Also, an $Al_xGa_{1-x}N$ layer 26, where 0<x<1, (hereinafter referred to as "AlGaN Layer") is interposed between the first and second n-type GaN layers 24a and 24b. The AlGaN layer 26 forms a two-dimensional electron gas (2DEG) layer at interfaces of the first and second n-type GaN layers 24a and 24b.

Typically, AlGaN grown on GaN suffers tensile stress from lattice mismatch, thus resulting in polarization induced by a relatively strong piezoelectric effect. The electric field caused by such spontaneous polarization allows the high-energy two-dimensional electron gas layer to be formed at bonding interfaces. This two-dimensional electron layer exhibits high electron mobility and saturated electron velocity. Therefore, despite a decrease in doping concentration of impurities such as Si which adversely affects crystalinity in the n-type nitride layer, sheet carrier concentration can be heightened to attain a sufficient current spreading effect. Further, according to the invention, n-type GaN layers 24a and 24b may be disposed on both sides of the AlGaN layer 26, allowing formation of the beneficial 2DEG layer and thereby boosting current spreading effect more.

In forming a heterogeneous structure of AlGaN/GaN to improve current spreading effect as described above, two critical factors should be satisfied, i.e. a thickness t1 of the AlGaN layer 26 and a band gap difference between the AlGaN layer 26 and the n-type GaN layers 24a and 24b. Herein, the band gap difference can be adjusted by Al content in the AlGaN layer 26. The two determinant factors for forming the 2DEG layer are inversely proportional. But according to the invention, the thickness t1 of the AlGaN layer 26 ranges from 100 Å to 500 Å, and the Al content of the AlGaN layer 26, as indicated with x in the formula of $Al_xGa_{1-x}N$, where 0<x<1, ranges from about 0.05 to 0.5. At this time, the AlGaN layer 26 may be an undoped layer where impurities are intentionally undoped.

Moreover, the first and second n-type GaN layers 24a and 24b, at a thickness of about 80 Å or more, enable growth of the 2DEG layer. Therefore, the first and second n-type GaN layers 24a and 24b may be grown to an adequate thickness in consideration of the thickness of the typical n-type nitride layer.

As in the embodiment, more preferably, the AlN layer 25 may be interposed between the AlGaN layer 26 and the first n-type GaN layer 24a. The AlN layer 25 of the invention can considerably increase electron concentration of the 2DEG layer through additional piezoelectric effect (see FIG. 3). Further, due to insulating properties, the AlN layer 25, if formed in a film, blocks dislocation and enhances current spreading effect. The AlN layer 25, at a thickness t2 less than 5 Å, does not ensure a sufficient effect. Also, the AlN layer 25, at a thickness exceeding 30 Å may function as an insulating crystal layer, adversely affecting the device. Therefore, to properly achieve effects such as dislocation blockage and current spreading, the AlN layer 25 has a thickness of preferably about 5 Å to 30 Å, most preferably about 10 Å. In this embodiment, the AlN layer 25 is interposed between the AlGaN layer 26 and the first n-type GaN layer 24a but alternatively may be positioned between the AlGaN layer 26 and the second n-type GaN layer 24b.

In addition, a GaN layer 23 containing less than 1 mol % Al may be grown between the substrate 21 (the buffer layer 22 in this embodiment) and the first n-type GaN layer 24. A small amount of Al, which is the group III element, is doped to perform passivation on Ga vacancies present as defects in the active layer, thereby inhibiting growth thereof into two or three-dimensional dislocations and enabling trapped electrons to move. Consequently, the GaN layer 23 doped with a small amount of Al increases crystalinity and electronic concentration. The method for doping a small amount of Al and its effects are disclosed in Korean Patent Application No. 2004-039101 filed by the assignee of this application.

In the mesa-etched planar light emitting device according to the embodiment, preferably, to ensure higher current spreading effect, the depth of mesa etching is properly set with respect to an interface where the 2DEG layer is formed. Preferably, the interface of the first n-type GaN layer 24a where the 2DEG is formed is substantially flush with or moderately higher than an exposed area of the mesa-etched n-type nitride layer where the n-electrode 29a will be formed.

More preferably, as shown in FIG. 2, the exposed area of the mesa-etched n-type nitride layer is substantially flush with the interface of the first n-type GaN layer 24a where the 2DEG is formed. Thereby, the 2DEG layer can be utilized more effectively to further enhance current spreading effect.

Figure 3:
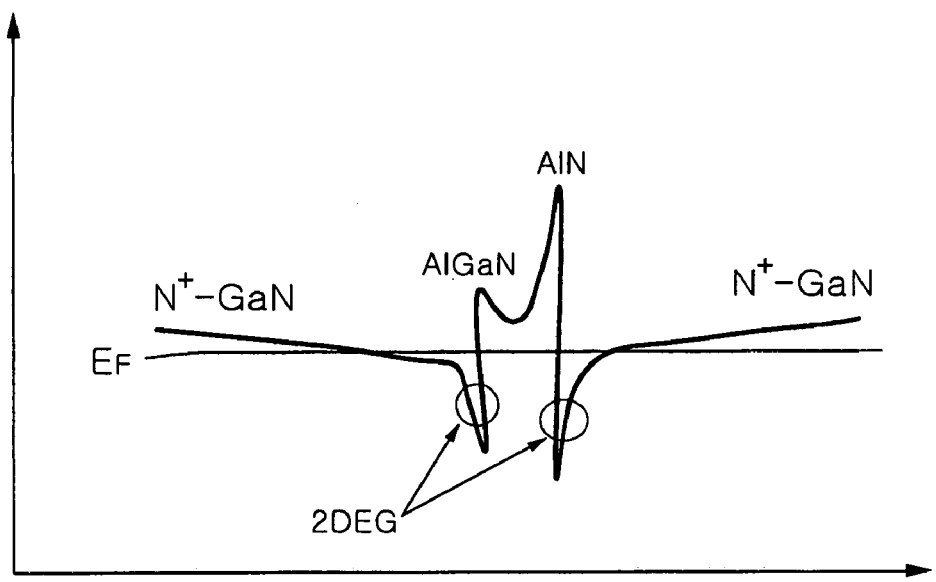
FIG. 3 is a band diagram of a heterogeneous bonding structure of GaN/AlGaN/AlN/GaN according to the invention.

FIG. 3 is a band diagram of a heterogeneous bonding structure of GaN/AlGaN/AlN/GaN preferably employable in the invention.

The band diagram of FIG. 3, apparently relates to a bonding structure, as shown in FIG. 2, where AlGaN and AlN layers are interposed between the n-type GaN layer and n-type GaN layer.

The n-type GaN layers disposed at both sides of the AlGaN layer generates a piezoelectric effect at both interfaces due to lattice mismatch. This piezoelectric effect of AlGaN/GaN heterogeneous bonding structure is 3 times stronger than that of AlGaAs/GaAs, and spontaneous polarization allows formation of a 2DEG layer having a high energy of about 2 to $5/cm^2 \times 10^{13}/cm^2$ at bonding interfaces. The 2DEG layer can have a high electron mobility of 1900 $cm^2/V \cdot s$ and a saturated electron velocity of 2.2 $cm/s \times 10^7$ cm/s at a room temperature.

Also, the AlN layer added enhances the piezoelectric effect so that concentration of the 2DEG layer formed at both interfaces can be increased. Furthermore, the thickness of the AlN layer, which is an insulating material, can be adjusted adequately to block dislocation spread in a growth direction and thus improve crystalinity. Also, at this time, additional current spread effect is attainable as a current blocking layer. To realize this, the AlN layer has a suitable thickness of about 5 Å to 30 Å.

Figure 4:
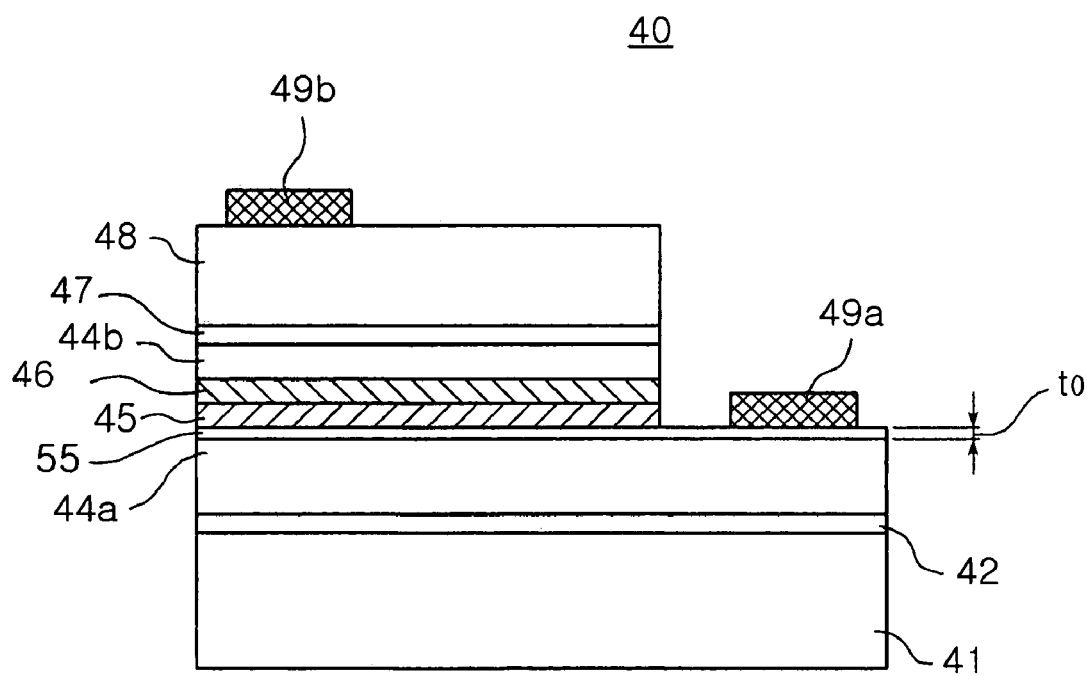
FIG. 4 is a vertical cross-sectional view illustrating a nitride semiconductor light emitting device according to another embodiment of the invention.

FIG. 4 is a vertical cross-sectional view illustrating a nitride semiconductor light emitting device according to another embodiment of the invention. In this embodiment, an undoped high-resistant GaN layer, which is intentionally undoped, is added to improve current spreading effect.

Referring to FIG. 4, the nitride semiconductor light emitting device 40 includes a sapphire substrate 41, a buffer layer 42 formed on the sapphire substrate 41, n-type nitride semiconductor layers 44a and 44b formed on the buffer layer 42, an active layer 47 formed on the n-type nitride semiconductor layer 44b and a p-type nitride semiconductor layer 48 formed on the active layer 47. An n-electrode 49a and a p-electrode 49b are formed, connected to the n-type and p-type nitride semiconductor layers, respectively.

The n-type nitride semiconductor layers, in a similar manner to FIG. 2, include the first n-type GaN layer 44a and the second n-type GaN layer 44b in the order of distance from the active layer 47. Also, an AlN layer 45 and an AlGaN layer 46 having a composition expressed by $Al_xGa_{1-x}N$, where 0<x<1, are grown between the first and second n-type GaN layers 44a and 44b. The AlGaN layer 46 allows the 2DEG layer to be formed at interfaces of the first and second n-type GaN layers 44a and 44b. Moreover, the AlN layer 45 increases concentration of the 2DEG layer.

As shown in FIG. 4, to maximize current spreading effect, a high-resistant GaN layer 55 may be inserted between the AlN layer 45a and the first n-type GaN layer 44a. The high-resistant GaN layer 55 of the invention is an undoped GaN layer where impurities are intentionally undoped. At this time, the 2DEG layer may be formed at an interface of the high-resistant layer 55 adjoining the AlN layer 45. Preferably, the high-resistant GaN layer 55 of the invention has a thickness to of 80 Å to 200 Å.

In addition, as in this embodiment, to maximize current spreading effect, preferably, the high-resistant GaN layer 55 is provided on an exposed area where the n-electrode 49a will be formed. That is, as shown in FIG. 4, the high-resistant GaN layer 55 is provided on the exposed area of the mesa-etched n-type nitride semiconductor layer. This can be achieved by mesa-etching to a proper depth.

In the embodiments as described above, a planar light emitting device was employed in the invention. But the invention is not limited thereto and applicable in a similar manner to a general vertical nitride semiconductor device requiring current spreading effect. Even in this case, current spreading effect is significantly boosted by forming a 2DEG layer.

As set forth above, according to the invention, an $Al_xGa_{1-x}N$ (0<x<1) layer is interposed between n-type nitride layers, and then a 2DEG layer is formed at interfaces of the n-type nitride layers. This increases sheet carrier concentration and enhances electron mobility, thereby enabling a high-efficient nitride semiconductor light emitting device with superior current spreading. Especially, an insulating AlN layer having a predetermined thickness is employed together with the AlGaN layer so that the 2DEG layer can be enhanced, and better crystalinity and additional current spreading effect can be obtained.

While the present invention has been shown and described in connection with the preferred embodiments, it will be apparent to those skilled in the art that modifications and variations can be made without departing from the spirit and scope of the invention as defined by the appended claims.

What is claimed is:

1. A nitride semiconductor light emitting device comprising:
   a substrate;
   a first n-type GaN layer, an $Al_xGa_{1-x}N$ layer (where 0<x<1), a second n-type GaN layer, an active layer and a p-type semiconductor layer sequentially formed on the substrate; and
   an AlN layer disposed between the $Al_xGa_{1-x}N$ layer and the first or the second n-type GaN layer, wherein
   two-dimensional electron gas layers are formed at interfaces between the first n-type GaN layer and the $Al_xGa_{1-x}N$ layer and between the $Al_xGa_{1-x}N$ layer and the second n-type GaN layer.

2. The nitride semiconductor light emitting device according to claim 1, wherein the $Al_xGa_{1-x}N$ layer has a thickness of about 100 Å to 500 Å.

3. The nitride semiconductor light emitting device according to claim 1, wherein the $Al_xGa_{1-x}N$ layer contains x in the range of about 0.05 to 0.5.

4. The nitride semiconductor light emitting device according to claim 1, wherein the $Al_xGa_{1-x}N$ layer comprises an undoped $Al_xGa_{1-x}N$ layer.

5. The nitride semiconductor light emitting device according to claim 1, wherein the AlN layer has a thickness of about 5 Å to 30 Å.

6. The nitride semiconductor light emitting device according to claim 1, further comprising a GaN layer disposed between the substrate and the first n-type GaN layer, the GaN layer doped with less than 1 mol % Al.

7. The nitride semiconductor light emitting device according to claim 1, wherein the nitride semiconductor light emitting device is mesa-etched to expose a partial area of the first n-type GaN layer.

8. The nitride semiconductor light emitting device according to claim 7, wherein the exposed area of the mesa-etched n-type nitride semiconductor layer is substantially flush with the interface between the $Al_xGa_{1-x}N$ layer and the first n-type GaN layer where the two-dimensional electron gas layer is formed.

9. The nitride semiconductor light emitting device according to claim 7, wherein the exposed area of the mesa-etched n-type nitride semiconductor layer is in a plane lower than that of the interface between the $Al_xGa_{1-x}N$ layer and the first n-type GaN layer where the two-dimensional electron gas layer is formed.

10. The nitride semiconductor light emitting device according to claim 1, further comprising a undoped GaN layer formed between the first n-type GaN layer and the $Al_xGa_{1-x}N$ layer,
   wherein the two-dimensional electron gas layer is formed at an interface between the undoped GaN layer and the $Al_xGa_{1-x}N$ layer.

11. The nitride semiconductor light emitting device according to claim 10, wherein the nitride semiconductor light emitting device is mesa-etched to expose a partial area of the undoped GaN layer.

12. The nitride semiconductor light emitting device according to claim 10, wherein the undoped GaN layer has a thickness of 80 Å to 200 Å.

13. The nitride semiconductor light emitting device according to claim 11, wherein the undoped GaN layer has a thickness of 80 Å to 200 Å.

14. The nitride semiconductor device according to claim 1, wherein the substrate is a conductive substrate, the nitride semiconductor light emitting device having a vertical structure in which a first electrode is formed on a lower surface of the conductive substrate and a second electrode is formed on the p-type nitride semiconductor layer.

* * * * *